United States Patent [19]

Engeler et al.

[11] Patent Number: 4,782,249

[45] Date of Patent: Nov. 1, 1988

[54] STATIC CMOS PROGRAMMABLE LOGIC ARRAY

[75] Inventors: William E. Engeler, Scotia; Menahem Lowy; John T. Pedicone, both of Schenectady, all of N.Y.

[73] Assignee: General Electric Company, Schenectady, N.Y.

[21] Appl. No.: 81,076

[22] Filed: Aug. 3, 1987

[51] Int. Cl.$^4$ ..................................... H03K 19/177
[52] U.S. Cl. ................................... 307/469; 307/451; 307/272.2
[58] Field of Search ............... 307/443, 448, 451, 465, 307/468–469, 481, 585, 272 A; 364/716

[56] References Cited

U.S. PATENT DOCUMENTS

| | | | |
|---|---|---|---|
| 4,349,888 | 9/1982 | Smith | 364/716 |
| 4,506,341 | 3/1985 | Kalter et al. | 307/465 X |
| 4,534,008 | 8/1985 | Fuchs et al. | 364/716 |
| 4,591,993 | 5/1986 | Griffin et al. | 364/716 X |
| 4,645,952 | 2/1987 | van Tran | 307/451 X |
| 4,661,922 | 4/1987 | Thierbach | 307/465 X |

OTHER PUBLICATIONS

Cases et al, "CMOS Programmable Logic Array", IBM T.D.B., vol. 26, No. 11, Apr. 1984, pp. 5835–5837.
Weste and Eshraghian, Principles of CMOS VLSI Design, Addison-Wesley Pub. Co., pub. 1985, pp. 368–379.

*Primary Examiner*—Stanley D. Miller
*Assistant Examiner*—D. R. Hudspeth
*Attorney, Agent, or Firm*—Geoffrey H. Krauss; James C. Davis, Jr.; Marvin Snyder

[57] ABSTRACT

A CMOS programmable logic array includes a logical AND plane receiving a first group of input logic signals for forming a second group of logic minterms, and a logical OR plane receiving the logic minterms for forming a third group of output logic signals. Each type of logical plane contains a plurality of logic gates. Each plane type can be formed from the other plane type by the addition of a logic inverter to each input, and output of, that other-type plane. Interconnections determine the combination of input signals used to define the logic equation of the signal at the output of each logic gate of each plane. Static latches are used to retain the states of input and minterm logic signals. Logic planes and latches can be operated responsive to a two-phase clock signal.

16 Claims, 4 Drawing Sheets

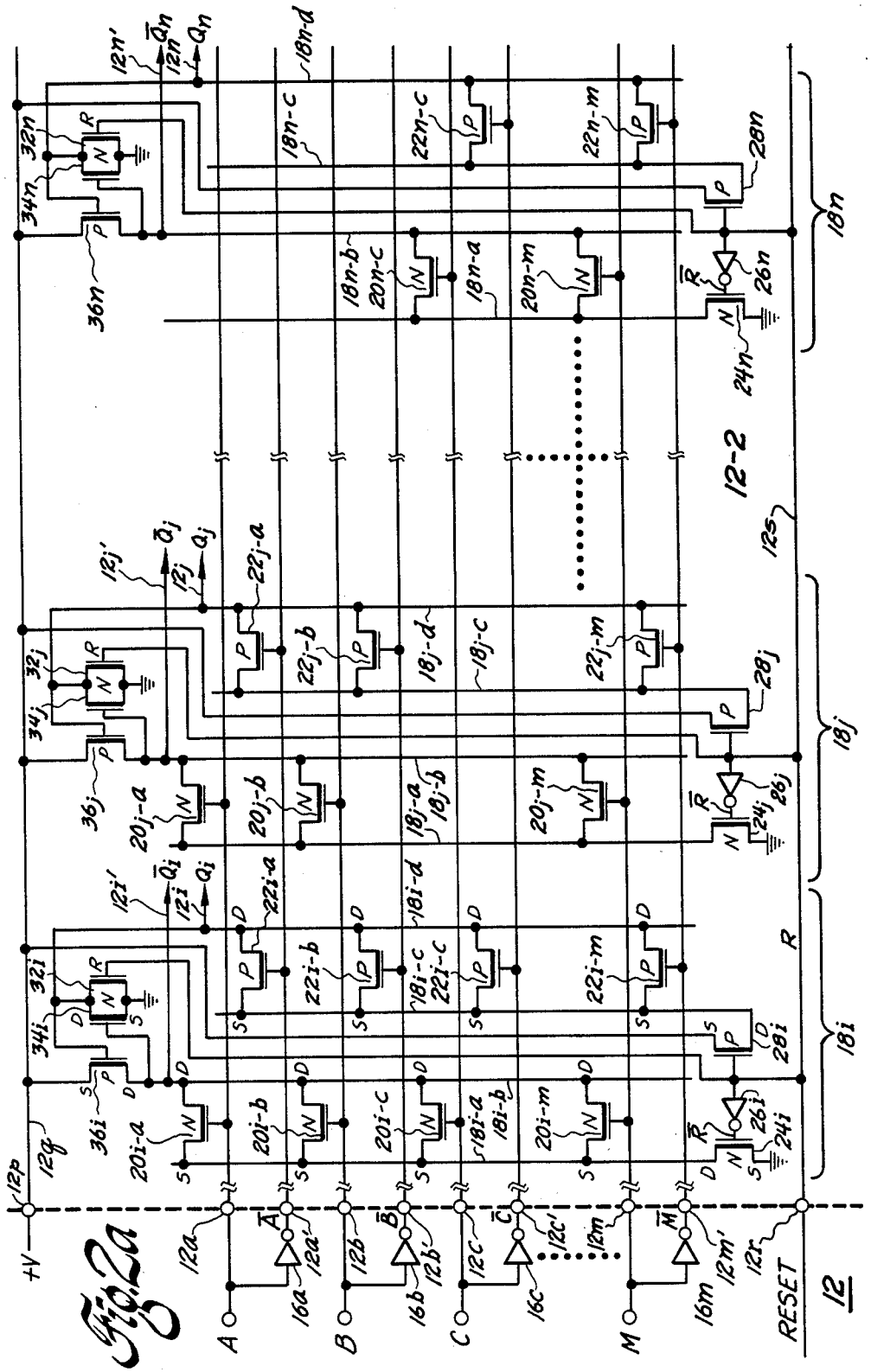

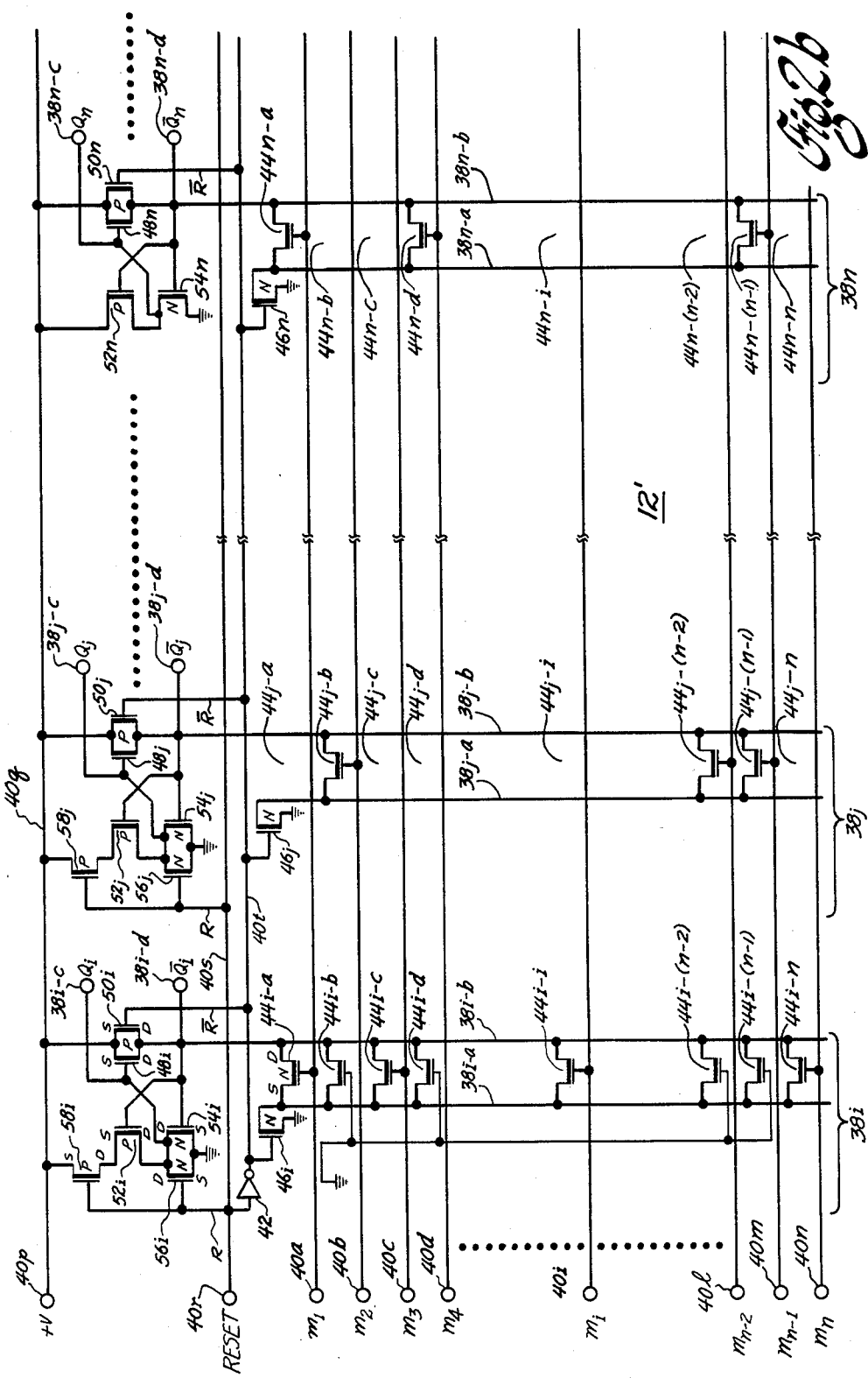

STATIC CMOS PROGRAMMABLE LOGIC ARRAY

BACKGROUND OF THE INVENTION

The present invention relates to programmable logic arrays and, more particularly, to a complementary metal-oxide-semiconductor (CMOS) form of programmable logic array (PLA) which is fully static and consumes substantially zero power in a stationary state.

It is well known that one important integrated circuit building block is the programmable logic array, in which a relatively large plurality of input binary logic terms can be combined, according to particular logic equations worked out by the system designer, to provide output logic terms unique to a particular use. Typically, a PLA utilizes a set of AND or NAND gates to provide intermediate logic terms, sometimes referred to as minterms. A second group of gates may be utilized to provide the logic OR or NOR of selected minterms, to derive the output terms. In some PLAs, the various interconnections can be made in the field (so-called field programmable PLAs), rather than by the interconnection means, e.g. metalization masking patterns, which are introduced during the integrated circuit fabrication. Similarly, the interconnective mask patterns can be so arranged that some of the output terms are fed back to become certain of the input signals, so that the PLA can be utilized to realize a finite-state machine.

A PLA can have a relatively simple form if n-channel technology is utilized for the MOSFET devices of the PLA; this relatively simple form suffers from several undesirable characteristics, including the consumption of power even when the PLA is in a "stationary" state, i.e. the input terms are not in a state of change. It is also well known that integrated circuitry provided with complementary MOSFET devices (CMOS integrated circuitry) will provide no-power stationary states, but will not have the relatively simple form of NMOS integrated circuits, as a large number of series-connected n-channel devices, equal to the number of inputs necessary to form the minterms in the AND plane, are required. Thus, fully-featured CMOS PLAs are either very slow, if standard NAND gates are formed with long serial chains of n-channel transistors, or lose some of the desired CMOS features, if faster structures are employed. A CMOS PLA can be formed with "domino" logic structures, which, while small and fast, are dynamic and have a minimum operating frequency. Likewise, circuits with pull-up devices can be made small and fast, but require a current flow to exist at all times. Hitherto, a completely satisfactory circuit solution, resulting in full CMOS logic features, in a programmable logic array, has not been realizable.

BRIEF SUMMARY OF THE INVENTION

In accordance with the invention, a CMOS programmable logic array includes: a logical AND plane receiving a first plurality of input logic signals for forming a second plurality of logic minterms; and a logical OR plane receiving the logic minterms for forming a third plurality of output logic signals. Each type of logical plane contains a plurality of logic gates. Each plane type can be formed from the other plane type by the addition of a logic inverter to each input to, or output of, that other-type plane. Interconnecting means determine the combination of input signals used to define the logic equation of the signal at the output of each logic gate of each plane. Each gate comprises a set of busses and at least one subarray of devices for selectively interconnecting pairs of the busses only when an input signal of a predetermined form is present, to cause a designated output bus to be controlled to a predetermined logic state if any device coupled thereto is in a selected state.

In presently preferred embodiments, static latches are used to retain the states of input and minterm logic signals. The logic planes and latch means are operated responsive to a two-phase clock signal.

Accordingly, it is an object of the present invention to provide a substantially static CMOS programmable logic array.

This and other objects of the present invention will become apparent upon a reading of the following detailed description, when considered in conjunction with the drawings.

BRIEF SUMMARY OF THE DRAWINGS

FIG. 2a is a schematic diagram of a first presently preferred PLA embodiment, in accordance with the present invention; and FIG. 2b is a schematic diagram of a second presently preferred PLA embodiment, in accordance with the principles of the present invention.

DETAILED DESCRIPTION OF THE INVENTION

Figure 1:
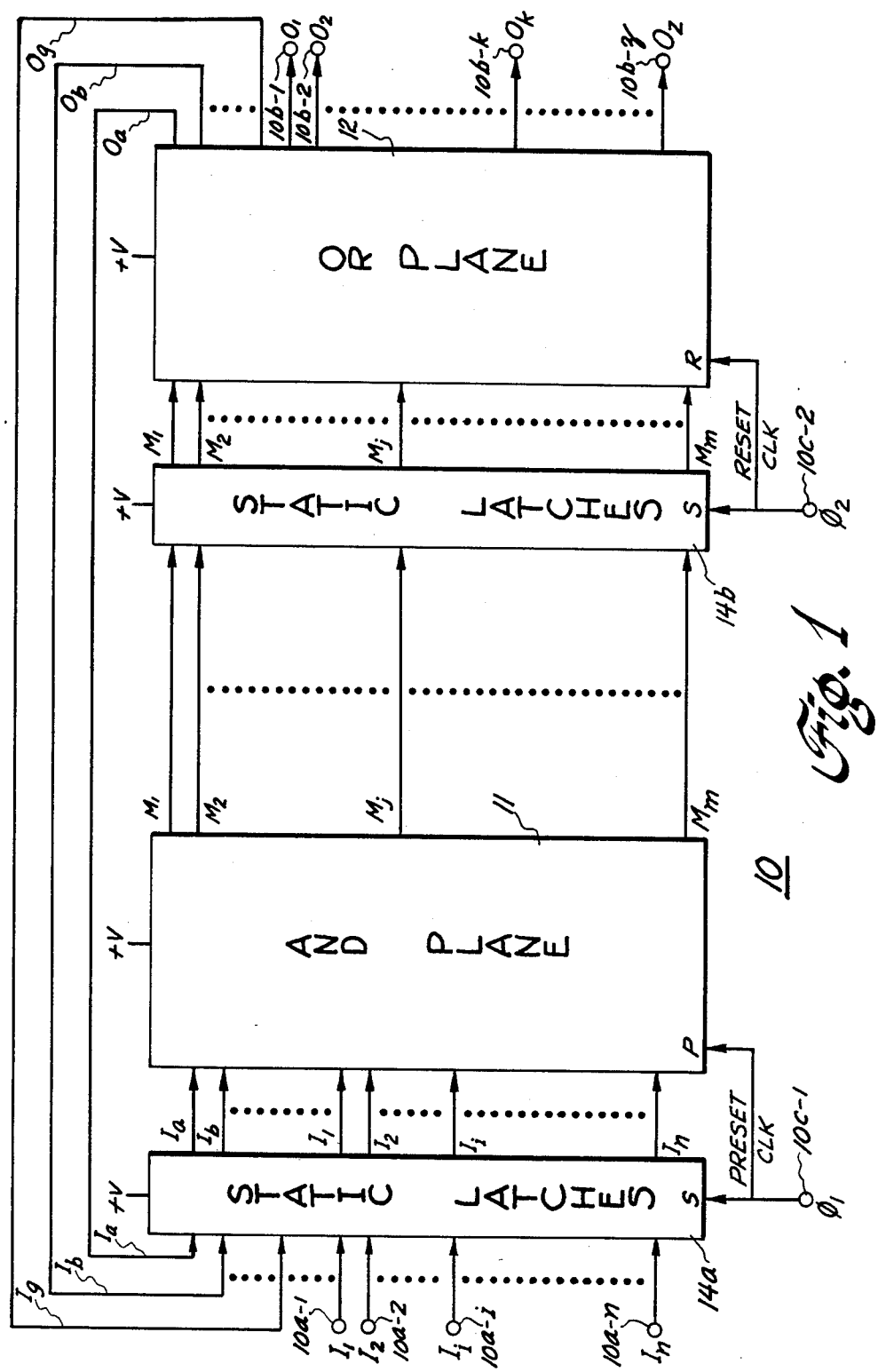
FIG. 1 is a block diagram of a PLA in accordance with the principles of the present invention.

Referring initially to FIG. 1, a fully static CMOS programmable logic array (PLA) 10 receives each of a first plurality N of input logic signals $I_i$ ($1 \leq i \leq n$) from an associated one of input terminals 10a-i; each of another plurality Z of output logic signals $O_k$, where $1 \leq k \leq z$, will be provided at an associated one of output terminals 10b-k. PLA 10 includes a first logical plane 11, or group, of a plurality of a first type of logic gate. Here, the first plane 11 is comprised of logic gates for forming AND logic terms. The AND plane 11 receives the first plurality N of input signals $I_i$, e.g. input signals $I_1, I_2, \ldots, I_n$, for forming a second plurality M of intermediate, or minterm, logic signals M, e.g. minterm signals $M_1, M_2, \ldots, M_m$. A second logical plane 12 receives the second plurality of minterm $M_j$ logic signals, where $1 \leq j \leq m$, for carrying out upon designated combinations thereof another logic operation, e.g. the OR logic operation, to provide a third plurality X of output $O_k$ signals, e.g. output signals $O_a, O_b, \ldots, O_g, O_1, O_2, \ldots, O_z$. The OR plane 12, as the last plane in a PLA 10, may, if desired, provide some of its output signals $O_a, O_b, \ldots, O_g$ as feedback signals to designated ones of the inputs $I_a, I_b, \ldots, I_g$, of the first plane in a sequential set of series-connected planes, such that PLA 10 becomes a finite-state machine. The remaining plurality Z (where Z'X) of the output signals $O_k$, i.e. $1 \leq k \leq z$ for outputs $O_1, O_2, \ldots O_z$, remain as the PLA output logic signals for connection to output terminals 10b-k. Advantageously, each logical plane is preceded by an associated one of a plurality of static latch means 14, for receiving the binary logic signals provided thereto. Here a first static latch means 14a receives the input logic signals $I_1, I_2, \ldots, I_n$, for storage therein responsive to a specific binary state of a first phase $\phi_1$ of a clock signal appearing at a latch means store S control input. A second set of static latch means 14b store, responsive to a second clock signal phase $\phi_2$ at a storage S control input thereof, the various minterm logic signals $M_1, M_2, \ldots, M_m$, and provide the most recently latched minterms to the inputs of OR plane 12. Also advantageously, the production of minterms $M_j$ is carried out, responsive to the $\phi_1$ clock signal at a preset P clock input of the AND plane 11, upon the logic states of all of the input $I_i$ signals at that time. Similarly, the output $O_k$ terms are provided by the OR plane, responsive to the presence of a $\phi_2$ clock pulse at the reset R input of plane 12, upon the logic states of all of the minterm $M_j$ signals then present at the OR inputs. Additional AND/OR plane pairs, with each plane preferably preceded by a clocked latch means, can be sequentially added, if desired, to allow complicated logical expressions (including those requiring several gate delays for timing purposes) to be generated and run at a higher speed in one PLA. All of the active devices in the planes and latches of PLA 10 are of CMOS design, so that PLA 10 is a fully static integrated circuit.

Figure 1A:
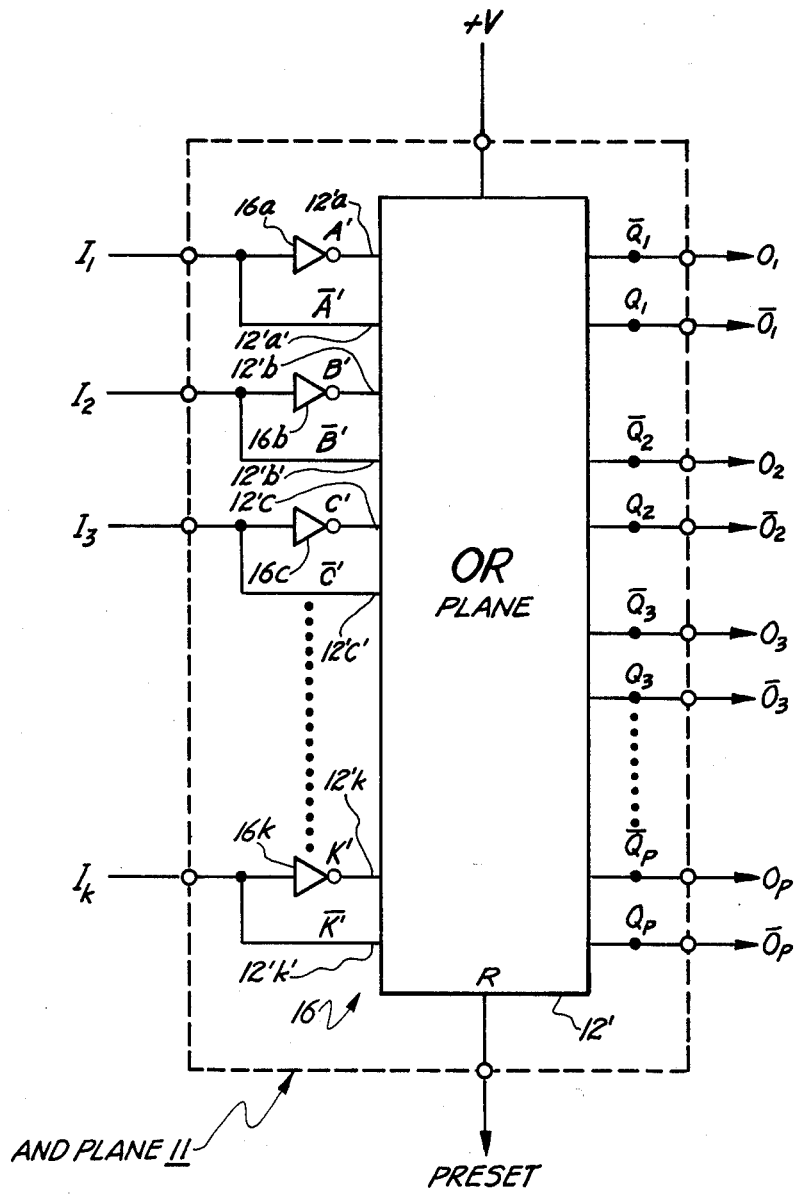
FIG. 1a is a schematic block diagram of a logical AND plane for use in the present invention, illustrating the fabrication thereof from a logical OR plane.

Referring now to FIG. 1a, either one of planes 11 or 12 can be formed of the other one of planes 12 or 11, with the addition of input or output signal logic inverters 16. Thus, the AND plane 11 can be formed of a second OR plane 12', utilized with the set of input signal logic inverters 16. In the illustration, input signal logic inverters are used; each of the OR plane non-complement logic inputs $12'a, 12'b, 12'c, \ldots, 12'k$ receives an associated signal $A', B', C', \ldots, K'$ from the output of an associated one of the set of input inverters $16a, 16b, 16c, \ldots, 16k$. Each signal $A', B', C', \ldots, K'$ is the inverse of the respective associated input signal $I_1, I_2, I_3, \ldots, I_k$. Each of the OR plane 12' complement inputs $12'a', 12'b', 12'c', \ldots, 12'k'$ receives the associated one of the input signal $I_1, I_2, I_3, \ldots I_k$ as the complement input signal $\overline{A}', \overline{B}', \overline{C}', \ldots, \overline{K}'$. Thus, the input signal $A'$ is actually a normally-false $I_1$ signal, i.e. $A' = \bar{I}_1$, $B' = \bar{I}_2$, $C' = \bar{I}_3, \ldots, K' = \bar{I}_k$. By reversing the "true"/"false" sense of the respective OR plane logic outputs $\overline{Q}$ and $Q$, to obtain the AND plane outputs O and $\overline{O}$, respectively, the AND function is obtained. That is, any particular complementary output $\overline{O}_p$ is the true $Q_p$ signal which is the OR'ing of a plurality of input terms $A', B', C', \ldots, K'$, such that the Boulean logic expression for $\overline{O}_p$ is $\overline{O}_p = A' + B' + \ldots$ Therefore, $\overline{O}_p = \bar{I}_1 + \bar{I}_2 + \ldots$ By DeMorgan's rule, $\overline{O}_p = I_1 \cdot I_2 \cdot \ldots$, which is the NAND logic form, and the complementary $O_p$ term is then the AND logic term, e.g. $O_1 = I_1 \cdot I_2 \cdot \ldots$, and so forth. It will be seen that an AND plane 11' could have been used with a set of input (or output) inverters to provide an OR plane 12. Thus, only one form of logic plane, of either the AND or OR form, is required. The requirements of the AND plane, and the nature of the OR plane circuits, described hereinbelow, make it advantageous to form both the AND plane and the OR plane from basic OR plane forms. That is, the OR plane is formed directly and the AND plane is then formed from a basic OR plane, using the logical interconnections described above. In general, an AND plane requires that for each input term, the input and its logical inverse be formed. The output of the OR circuit also generates both an output signal and its logical inverse. Thus, the transformation of the OR circuits to their AND plane form can be simply accomplished by means of interconnections only, and without the need for any additional circuit elements. For both this reason, and because of speed advantages which will become apparent below, use of the basic OR plane to realize an AND plane is a preferred embodiment of our PLA.

Referring now to FIG. 2a, a first presently preferred CMOS logical OR plane 12 comprises a plurality of OR logic gates $18x$, where $i \leq x \leq n$, e.g. a first OR gate $18i$, a second OR gate $18j, \ldots,$ a last OR gate $18n$. Each OR gate $18x$ receives both the "true" logic input signals $A, B, C, \ldots, M$ respectively at respective inputs $12a, 12b, 12c, \ldots, 12m$ and the "false" logic input signals $\overline{A}, \overline{B}, \overline{C}, \ldots, \overline{M}$ respectively at respective inputs $12a', 12b', 12c' \ldots, 12m'$. Each gate provides its output and output complement signals at the associated one of "true" gate outputs $12i, 12j, \ldots, 12o$, respectively, and the associated one of the complementary "false" gate outputs $12i', 12j', \ldots, 12n'$, respectively. Each gate $18x$ also receives an operating potential $+V$ from a power input $12p$, via a common operating potential bus $12q$, and receives a common reset R signal from a reset input $12r$, via a common reset bus $12s$. Each gate $18x$ contains a first subarray of a first polarity-type of semiconductor switching devices, e.g. n-channel devices 20; each device $20x$ is placed with a source S electrode connected to a first gate bus $18x$-$a$ and a drain D electrode connected to a second gate bus $18x$-$b$, from which the output complement signal $\overline{Q}_x$ is taken. Each gate $18x$ also contains a second subarray of an opposite-polarity type of switching devices, e.g. p-channel devices 22; each device $22x$ is placed with a source S electrode connected to a third gate bus $18x$-$c$ and a drain D electrode connected to a fourth gate bus $18x$-$d$, from which the output true signal $Q_x$ is taken. The interconnection means, e.g. the metalized mask patterns used to define conductive pathways in the PLA integrated circuit, can be so designed that (a) the gate electrode of a first subarray n-channel device 20 is connected to one of the input "true" logic signals only if that signal is to be present in the OR logic "false" output signal $\overline{Q}_x$ to be produced by that gate $18x$ and (b) the gate electrode for an associated second subarray p-channel device 22 is connected to the associated input "false" logic signals to be present in the OR logic "true" output signal $Q_x$ to be produced by that same gate $18x$. It will be understood that a pair of conjugate devices 20 and 22 are used for each input term present in the output logic expression from any one gate $18x$ and that the pair of devices need only be present for such included term; a non-included input term can be represented either by the non-presence of the device pair or by the non-connection of at least one electrode of each device of the pair. Thus, if first gate $18i$ has an output signal $Q_i = A + B + C + \ldots + M$, the first subarray n-channel devices $20i$-$a$, $20i$-$b$, $20i$-$c$, $\ldots$, and $20i$-$m$ are present and connected; the second subarray p-channel devices $22i$-$a$, $22i$-$b$, $22i$-$c$, $\ldots$ and $22i$-$m$ are also present and connected. Similarly, if second gate $18j$ has an output $Q_j = A + B + M$, then the first subarray has only the n-channel devices $20j$-$a$, $20j$-$b$ and $20j$-$m$ present and connected, while the second subarray has only p-channel devices $22j$-$a$, $22j$-$b$ and $22j$-$m$ present and connected. Further, if last gate $18n$ is to provide the logic output $Q_n = C + M$, then the first subarray only has n-channel devices $20n$-$c$ and $20n$-$m$ present and fully connected, while the second subarray has only p-channel devices $22n$-$c$ and $22n$-$m$ present and fully connected.

Each gate $18x$ has a first n-channel resetting device $24x$, having a drain D electrode connected to first gate bus $18x$-$a$, a source S electrode connected to gate common potential, and a gate electrode receiving an inverted reset $\overline{R}$ signal from the output of a gate reset logic signal inverter 26x (receiving the reset R signal from bus 12s). A second reset device 28x is a p-channel device having a drain D electrode connected to the gate third bus 18x-c and having a source S electrode connected to the gate operating potential +V on bus 12q; device 28i receives the R reset signal on bus 12s. This R reset signal is also provided to the gate electrode of another n-channel device 32x, having a drain D electrode connected to gate fourth bus 18x-d and a source electrode connected to common potential. Another n-channel device 34x has the drain and source electrodes thereof in parallel connection to the drain and source electrodes of device 32i, and has its gate electrode connected to the gate second bus 18i-b. Another p-channel device 36i has its source S electrode receiving operating potential +V from bus 12q and has its drain D electrode connected to the gate second bus 18x-b, while its gate electrode is connected to fourth gate bus 18x-d. With the common drain connections of the n-channel devices 20 forming the gate false $\overline{Q}_x$ output and the common drain connections of the p-channel devices 22 forming the gate true $Q_x$ output, the cross-coupled n-channel device 34x and p-channel device 36x statically hold the respective $Q_x$ and $\overline{Q}_x$ states, after release of reset; the n-channel device 32x is utilized to force the $Q_x$ output to a low logic condition when the reset R clock is at a high logic level. It will be seen that the common source connection to ground of all of the OR-plane n-channel devices 20 is accomplished, after gate reset, with the n-channel device 24x, while the common source connection of all of the p-channel devices 22 is placed, also after gate reset, at the high logic level by p-channel device 28x. When the reset R clock signal is at a high logic level condition, the subarray devices 20 and 22 are isolated from their operating supplies, such that a high logic level of the reset R clock will reset the $Q_x$ gate output to a low logic level (and, of course, reset the $\overline{Q}_x$ output to a complementary high logic level), independent of the state of the input signals at input terminals 12a-12m and 12a'-12m'.

In operation, the basic OR function of a gate 18x commences with the pulsing of the reset R clock to a high logic level and subsequent release to a low logic level. The high logic level pulse resets the gate output $Q_x$ to a low logic level condition. Release of the reset R clock to the low logic level removes the clamp on the $Q_x$ output provided by action of device 32x and connects the common source connections of the array devices to their respective common potential and operating potential busses 12s and 12q, respectively, by action of respective devices 24x and 28x. Thereafter, those of the n-channel devices 20 and the p-channel devices 22, having gates connected to the desired gate subset of minterm true and false inputs, respectively, operate to respectively pull the gate "false" output $\overline{Q}_x$ node 12x' to a low logic condition if any one of inputs 12a-12m (connected to any one of the actual n-channel devices present and fully connected) is at a high logic level, and to simultaneously pull the logic level at the gate "true" output $Q_x$ node 12x to a high level if any one of the p-channel devices 22x is enabled to a low logic level by a high level at one of the complement input terminals 12a'-12m'. The states at output nodes 12x and 12x' are held by the static cross-coupled devices 34x and 36x until cleared by the reset R signal pulse in the next clock cycle, when the entire operation again occurs. Thus, it will be seen that this OR gate does not consume power in its stationary state as all device states are static, i.e. all structure states are held by active devices. An output logic voltage-swings substantially from the common potential on bus 12s to the operating potential on bus 12q, so that all system states are either fully high at the operating potential or fully low at the common potential. All nodes, being charged or discharged through one, or at the most two, active device, provide high speed performance. Further, the circuit action is independent of the size of the gate subarrays, so that relatively complex logic arrays can be formed.

Referring now to FIG. 2b, another presently preferred fully-static CMOS embodiment 12' of a logical OR plane is illustrated. This embodiment also has a plurality of individual OR gates 38i, 38j, ..., 38n, which each form a selected OR combination of a plurality of input, or minterm, logic signals $m_i$, where $1 \leq i \leq n$, at respective inputs 40a-40n. The entire plane receives operating potential +V at a terminal 40p, for distribution to each gate via an operating potential bus 40q; a reset R signal is received at an input 40r, for distribution on a reset bus 40s. The reset R signal is inverted, by a logic inverter 42, to provide an inverted reset $\overline{R}$ signal on a reset-complement bus 40t, thereby reducing to one the number of reset signal inverters for the entire plane (rather than requiring n such inverters for n gates as in the logical plane embodiment of FIG. 2a). Each gate 38x comprises only one subarray 44 having a plurality N of n-channel devices 44x. Devices 44 are connected between a first gate bus 38x-a and a second gate bus 38x-b. Each of devices 44x is controlled by one of the signals at inputs 40a-40n only if that input signal is connected by the interconnection conductors so as to be present at the gate electrode of that device and be one of the input signal terms controlling the logic output for that particular gate 38x. Thus, while all of the devices 44 for a particular gate 38 may be present, the logic equation relating the logical plane inputs to the output for that one gate will determine whether any one of the device electrodes is connected to the associated input or either one of buses 38x-a or 38x-b, even if all devices are physically present. Thus, in first gate 38i, the plurality n of devices 44i-a through 44i-n are physically present and have their source S electrodes connected to first bus 38i-a and their drain electrodes connected to second bus 38i-b, but only have the gate electrodes connected to the associated one of input 40a-40n if that input is to be a term in the output of that gate. It will be seen that gate 38i is thus configured for the output true terminal 38i-c to have a "true" signal $Q_1 = m_1 + m_3 + m_i + m_n$; the complementary $\overline{Q}_1$ output terminal 38i-d has the complement formed thereat. The control gate electrode of each device 44i-x which is not connected for output logic contribution must be held at a low logic level, as by connection to a common potential bus 38i-g; this connection avoids uncontrolled leakage current flow between buses 38i-b and 38i-a. However, control by connection and disconnection of the gate electrode still allows the source-drain channel leakage resistance of all unused devices to appear between buses 38i-a and 38i-b, adding to an undesirable current flow, as in device 44i-b and the like. A more desirable method of interconnection, when the device logic pattern is specified at the mask level (in an integrated circuit and the like), is to connect between the two busses the source-drain channels of only those devices actually involved in the generation of a particular gate output; thus, if a device is not needed then, its gate electrode and its channel region are both disconnected from the array, e.g. either the source S electrode thereof is disconnected from the first bus 38x-a of the gate, or the drain D electrode of that device is disconnected from the second bus 38x-b of that gate. If only the source region is maintained in connection to bus 38x-a then higher speed performance results. Even higher speed performance may be achieved by not forming any portion of device if that subarray device is not needed. The latter form is shown in gates 38j and 38n, where unused device 44j-a, 44j-c, 44j-d, 44j-i and 44j-n, and 44n-b, 44n-c, 44n-i, 44n-(n$^{-2}$) and 44n-n, while designated, are not present (i e. all three electrode connections are not completed).

Each gate first bus 38x-a is connected through the drain-source channel of an n-channel device 46x to common potential, if the reset-component $\overline{R}$ signal at the gate electrode of that device 46x is at a high logic level, as will be obtained at all times that the plane is not in an active reset condition. The common drain D electrode connections of gate subarray devices 44x form the "false" output $\overline{Q}_x$ signal at the complement output node 38x-d of the gate. Also connected to the "false" output node 38x-d of the x-th gate are: the drain D electrode of first and second p-channel devices 48x and 50x; the gate electrode of another p-channel device 52x; and the gate electrode of an n-channel device 54x. The source electrodes of both of devices 48x and 50x are connected to the operating potential +V on bus 40q; the gate electrode of device 50i receives the reset-complement signal $\overline{R}$ from bus 40t. The gate electrode of device 48x is connected both to the "true" $Q_x$ output node 38x-c of the gate, and also to the drain D electrodes of the n-channel device 54x and another n-channel device 56x; the latter device has its drain-source channel connected in parallel with the channel of device 54x. The source S electrodes of both devices 54x and 56x are connected to common potential, while the gate electrode of device 56x is connected to the reset R signal bus 40s. A fourth p-channel device 58x also has its gate electrode connected to the reset R signal on bus 40s, has its source electrode receiving the operating potential +V on rail 40q, and has its drain D electrode connected to the source S electrode of the p-channel device 52x, which in turn has its drain D electrode connected to the drain D electrodes of devices 54x and 56x, and to the gate true output $Q_x$. The cross-coupled devices 48x and 54x act to statically hold the respective true Q mode 38x-c and the false $\overline{Q}$ node 38x-d, at the logic levels dictated by the connection of the subarray devices 44 and the state of the minterm input $M_i$ signals. In addition to the n-channel device 56x, which is utilized to force the true Q node 38x-c to a low logic condition when the reset R clock signal is at a high logic level, the p-channel device 50x serves to force the complementary output $\overline{Q}$ signal node 38x-d to a high logic level when the reset $\overline{R}$ clock signal is at that high logic level. Also, the p-channel device 52x assures that the true Q output node 38x-c goes to a high logic level if any one of subarray devices 44x pulls the complementary output $\overline{Q}$ node 38x-d to a low logic level.

In operation, each of a sequential plurality of clock cycles commences with a reset R signal pulse which temporarily turns off device 46x to disconnect the source S electrodes of all of the subarray n-channel devices 44x from common potential. Simultaneously, device 50x connects the complementary output node 38x-d to bus 40q, at the high logic level condition, while device 56x conducts to pull the "true" node 58x-c to the low logic level condition. This resetting of the true and false nodes 38x-c and 38x-d occurs independent of the state of the inputs 40a-40n. When the reset $\overline{R}$ signal at input 40r returns to a low logic condition, device 46x conducts, connecting the subarray source electrodes to common potential; devices 50x and 56x are controlled to the non-conductive condition and device 58x conducts, to connect the source electrode of cross-coupled output-holding device 52x effectively to operating potential +V rail 40q. Now that reset is released, any of the n-channel devices 44x in the subarray of a gate will be turned on by a high logic condition at any one of the minterm inputs 40a-40n, causing the gate "false" output $\overline{Q}_x$ node 38x-d to be pulled to a low logic level condition; p-channel device 52x will then pull the gate "true" output $Q_x$ node 38x-c to a high logic level condition and this state will be held by the cross-coupled devices 48x and 52x. Conversely, if all of the minterms are false, then all of the subarray devices are in the non-conductive condition, whereby the "false" gate output node 38x-d remains in the high logic level and the gate "true" node 38x-c remains in the low logic condition, as resulted from the reset action. If only a single false $\overline{Q}$ output signal is needed, or if both true and complement outputs are desired but the true Q output will be relatively lightly loaded, the gate circuit can be simplified by the removal of p-channel device 58x and n-channel device 56x, as shown e.g. in gate 58n, where devices 58n and 56n are not present and the source electrode of device 52n is connected directly to operating potential bus 40q. Note that this flow does not require the reset R signal for operation, as device 48n resets the $\overline{Q}$ node 38n-d to the high logic level condition and this causes device 54n to then set the Q node 38n-c to the low logic level condition while turning off device 52n. During the active (non-reset) portion of a cycle, operation is the same as described hereinabove.

It will be seen that the full OR plane is made of an array of all of the gates 38x, each of which receives as active inputs a different subset of the minterms, selected by the interconnection means to produce the desired gate OR function at the gate output nodes. It will also be seen that each OR gate does not consume power in its stationary state as all of these states are static, being held by active devices. Full bus-to-bus logic signal swing is achieved, because all system states are either fully at the high or low logic levels, each substantially equal to a selected one of the operating potential or the common potential. The various nodes are charged or discharged through one, or at the most two, active device so that, again, high speed performance is not only possible, but is also independent of the array size, so that complex logic arrays can be formed. It will also be seen that use of this OR plane, with a single subarray, as with use of the dual subarray embodiment of FIG. 2a (which itself requires both the minterm signal and its complement) also allows the AND plane 11 to be realized with a second OR plane 12' and a set of inverters. These inverters provide both the logic signal and its complement for use by the array of FIG. 2b in the AND plane 11 in place of the set of minterms $m_i, \ldots, m_n$. The logic signal true or logic signal complement is connected to each device 44 in accordance with the desired logical AND function to be implemented, as previously described with respect to FIG. 1a, and the AND plane output is taken at the $\overline{Q}$ output node.

While the several presently preferred embodiments of our novel method have been present herein by way of explanation, many variations and modifications will now become apparent to those skilled in the art. It is our intent, therefore, to be limited only by the scope of the appended claims.

What we claim is:

1. A static CMOS programmable logic array (PLA), comprising:
   input terminal means for receiving a plurality of PLA input logic signals;
   output terminal means for providing a plurality of PLA output logic signals;
   a plurality of static CMOS logical OR planes, each having a first plurality of inputs each for receiving a different plane input logic signal, a second plurality of outputs and a third plurality of logic gates each for forming at a different one of the outputs a plane output logic signal which is a logical OR'ing of different selected ones of the input logic signals for that plane, and with all of said gates consuming substantially zero power as long as the logic states of all of the plane input logic signals do not change;
   static CMOS means for providing, along with each logic signal input to at least one of the logical OR planes, another logic signal which is the logical inverse thereof, to convert each of said at least one logical OR planes to a logical AND plane, with each plane inverted output logic signal from that converted plane being a logical AND'ing of different selected ones of the input logic signals and the inverse input logic signals to the logical AND plane; and
   means for interconnecting the input terminal means to the plane inputs of a selected first one of the totality of OR and AND logical planes, for interconnecting the plane outputs of the selected first logical plane to the plane inputs of a second logical plane, for thence sequentially connecting the plane outputs of the second logical plane to the plane inputs, if any, of the remaining logical planes, and for connecting the plane outputs of the last of the totality of logical planes to said output terminal means, all in accordance with a predetermined pattern.

2. The PLA of claim 1, wherein each logical plane further comprises means for temporarily resetting each of the third plurality of logic gates in that plane to a preselected logic output condition responsive to receipt of a reset signal.

3. The PLA of claim 2, wherein the interconnecting means connects the plurality of logical planes in a sequential series of odd and even numbered planes, and further comprising: means for providing a two-phase clock signal; and means for resetting the odd numbered ones of the logcal planes responsive to a first phase of the clock signal at times different from the times at which even numbered ones of the logical planes are reset responsive to the remaining phase of the clock signal.

4. The PLA of claim 1, wherein each logical OR plane includes an array of a plurality of OR gates, each gate having a pair of subarrays of switching devices, with a first subarray being formed of a first channel-type of device and so connected as to form one of the gate true and false output logic signals responsive to preselected ones of the plane input logic signals being at preselected states, and with the other subarray being formed of a second channel-type of device, different from the first device channel-type, and so connected to form the remaining one of the gate false and true output logic signals responsive to the complementary ones of the plane input logic signals being at the complement of the preselected states.

5. The PLA of claim 4, wherein the first channel-type devices are n-channel devices.

6. The PLA of claim 5, wherein the first subarray forms the gate false output logic signal.

7. The PLA of claim 4, wherein each gate further includes: switching device means for resetting each gate output logic signal to a preselected state responsive only to a reset signal; and means for maintaining each of the gate true and false output logic signals in opposite logic states.

8. The PLA of claim 7, wherein the maintaining means includes a pair of cross-coupled opposite channel-type switching devices.

9. The PLA of claim 1, wherein each logical OR plane includes an array of a plurality of OR gates, each gate comprising: only one subarray of a plurality of switching devices all of the same channel-type and having channels connected in parallel to form a selected one of gate false and true output logic signals responsive to a preselected set of plane input logic signals being at preselected states; and cross-coupled devices for providing the other one of the gate true and false output logic signals responsive to the state of the gate output logic signal set by the subarray.

10. The PLA of claim 9, wherein each gate includes means for resetting the gate outputs to preselected states, responsive to a reset signal.

11. The PLA of claim 10, wherein each plane includes: means for receiving a single reset signal; and means for distributing the single reset signal to all gates of that plane.

12. The PLA of claim 11, wherein each plane further includes: means for forming an inverted reset signal; and means for distributing the inverted reset signal to all gates of that plane.

13. The PLA of claim 1, further including static latch means, preceding at least one of said logical planes, for storing at least one of the logic signals to be input to that logical plane.

14. The PLA of claim 13, wherein each logical plane is preceded by an associated static latch means.

15. A static CMOS programmable logic array (PLA), comprising:
   an AND logic plane receiving a first plurality of input logic signals for forming a second plurality of logic minterm signals;
   an OR logic plane receiving the minterm signals for forming a third plurality of output logic signals; and
   first and second static latch means, each preceding a different one of said AND and OR logic planes, for temporarily storing at least one of the logic signals to be input to that associated logic plane.

16. A static CMOS programmable logic array (PLA), comprising:
   an AND logic plane receiving a first plurality of input logic signals for forming a second plurality of logic minterm signals;
   an OR logic plane receiving the minterm signals for forming a third plurality of output logic signals; and
   means for resetting the minterm and logic output signals of the associated logic plane to preselected stages, responsive to a reset signal.

* * * * *